US012796340B2

(12) United States Patent
Schmidbauer et al.

(10) Patent No.: US 12,796,340 B2
(45) Date of Patent: Nov. 10, 2026

(54) PHASE CHANGE SWITCH WITH ADHESION LAYER

(71) Applicant: Infineon Technologies AG, Neubiberg (DE)

(72) Inventors: Sven Schmidbauer, Dresden (DE); Matthias Markert, Weinböhla (DE); Steffen Müller, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 431 days.

(21) Appl. No.: 18/387,505

(22) Filed: Nov. 7, 2023

(65) Prior Publication Data

US 2025/0151634 A1 May 8, 2025

(51) Int. Cl.
*H10N 70/20* (2023.01)
*H10N 70/00* (2023.01)

(52) U.S. Cl.
CPC ......... *H10N 70/231* (2023.02); *H10N 70/021* (2023.02); *H10N 70/823* (2023.02); *H10N 70/861* (2023.02)

(58) Field of Classification Search
CPC ............. H10N 70/8828; H10N 70/021; H10N 70/861; H10N 70/823; H10N 70/231; H10N 70/063; H10N 70/8613; H10N 70/026; H10N 70/041; H10N 70/8825; G11C 13/0004
See application file for complete search history.

(56) References Cited

U.S. PATENT DOCUMENTS

| | | | | |
|---|---|---|---|---|
| 10,804,463 | B2 | 10/2020 | Howard et al. | |
| 12,446,477 | B1 * | 10/2025 | Moon | H10N 70/026 |
| 2020/0058856 | A1 * | 2/2020 | Howard | H10N 70/231 |
| 2020/0111953 | A1 * | 4/2020 | Rose | H10N 70/231 |
| 2021/0035639 | A1 * | 2/2021 | Cohen | H10N 70/8613 |

* cited by examiner

*Primary Examiner* — Mouloucoulaye Inoussa
(74) *Attorney, Agent, or Firm* — Murphy, Bilak & Homiller, PLLC

(57) ABSTRACT

A semiconductor device includes a semiconductor substrate, a phase change switching device formed over the semiconductor substrate and including a strip of phase change material connected between an RF input contact and an RF output contact, and a heating element thermally coupled to the strip of phase change material, and a silicon adhesion layer that forms a direct interface with a first surface of the strip of phase change material and separates the first surface from a dielectric material formed thereon.

20 Claims, 2 Drawing Sheets

PHASE CHANGE SWITCH WITH ADHESION LAYER

BACKGROUND

Modern electronics applications require switching devices capable of accommodating very high frequency signals. For example, fifth generation (5G) wireless applications may operate in frequency bands on the order of 24 GHz (gigahertz) or higher. Maintaining correct ON/OFF ratio/isolation versus insertion loss/$R_{ON}$ (on-resistance) and $C_{OFF}$ (off-capacitance) for 5G applications may be difficult or impossible to achieve in current semiconductor technologies, such as CMOS technology. Phase change switches represent one promising technology that can meet the frequency requirements and insertion loss requirements for 5G applications. Phase change switches operate by modulating the conductive state of a phase change material through heating. Practical RF applications for phase change switches require downsize scaling while simultaneously maintaining a low on-resistance of the device. This creates high current and heat density, which creates challenges with respect to reliability.

SUMMARY

A semiconductor device is disclosed. According to an embodiment, the semiconductor device comprises a semiconductor substrate, a phase change switching device formed over the semiconductor substrate, the phase change switching device comprising a strip of phase change material connected between an RF input contact and an RF output contact, and a heating element thermally coupled to the strip of phase change material, and a silicon adhesion layer that forms a direct interface with a first surface of the strip of phase change material and separates the first surface from a dielectric material formed thereon.

A method of forming a semiconductor device is disclosed. According to an embodiment, the method comprises providing a semiconductor substrate, forming a phase change switching device over the semiconductor substrate, the phase change switching device comprising a strip of phase change material connected between an RF input contact and an RF output contact, and a heating element thermally coupled to the strip of phase change material, and a heating element thermally coupled to the strip of phase change material, and forming a silicon adhesion layer that forms a direct interface with a first surface of the strip of phase change material and separates the first surface from a dielectric material formed thereon.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments of a PCM (phase change material) switching device and corresponding methods of forming the PCM switching device are disclosed herein. The PCM switching device is embedded within a dielectric material such as silicon dioxide ($SiO_2$), silicon nitride (SiN) silicon oxynitride ($SiO_XN_Y$). This fabrication technique allows the PCM switching device to be fabricated on a semiconductor substrate using standard lithography techniques and provided within an interconnection region formed by so-called back end of the line processing steps, allowing for easy interconnection with other devices formed on or within the semiconductor substrate. However, one challenge associated with embedding the PCM switching device in dielectric material is the potential for delamination between the dielectric material and the phase change material. The embodiments disclosed herein provide an adhesion layer that directly interfaces with the phase change material of the PCM switching device and separates the phase change material from any regions or layers of dielectric material formed thereon. The adhesion layer provides a stable interface at high temperatures and consequently mitigates delamination. The thickness and material composition of the adhesion layer is tailored to ensure that the adhesion layer does not introduce a leakage path that significantly detrimentally impacts off state performance of the device.

Figure 1:
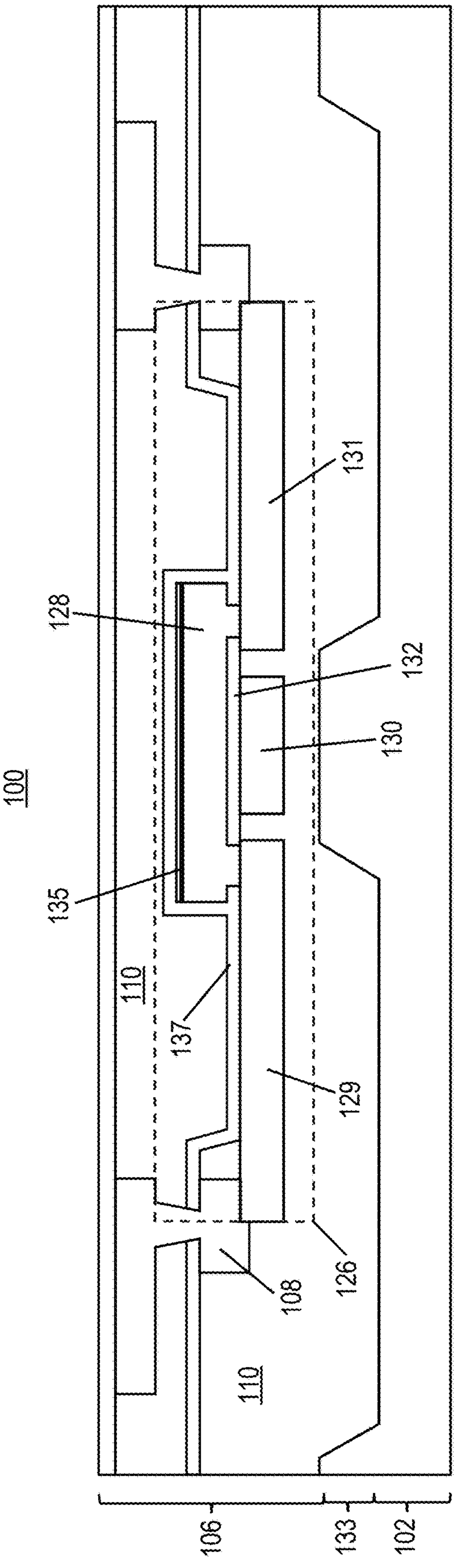
FIG. 1 illustrates a cross-sectional view of a PCM (phase change material) switching device, according to an embodiment.

Referring to FIG. 1, a semiconductor device 100 comprises a PCM switching device 126 that is formed on a semiconductor substrate 102. The semiconductor substrate 102 may be any type of substrate that is compatible with semiconductor processing techniques including lithography and the formation of and structuring of phase change materials. For example, the semiconductor substrate 102 can be a commercially available bulk semiconductor wafer, e.g., a silicon wafer or a so-called SOI substrate (silicon-on-insulator) wafer. Other types of semiconductors such as silicon carbide (SiC), or silicon germanium (SiGe), type III-V semiconductors, etc., may be present in the semiconductor substrate 102 and/or form the base material of the semiconductor substrate 102. In still other examples, the semiconductor substrate 102 can comprise other materials, e.g., glass, quartz, sapphire, etc.

According to an embodiment, the semiconductor substrate 102 is configured with semiconductor mesa structures that are laterally isolated from one another by dielectric regions comprising, e.g., silicon dioxide, silicon nitride, silicon oxynitride, etc. The semiconductor substrate 102 may be processed by a so-called STI (shallow trench isolation) technique, wherein the dielectric regions correspond to trenches that are etched and filled with dielectric material. Alternatively, a similar structure may be realized using a so-called SOI substrate (silicon-on-insulator) substrate wherein the semiconductor mesa structures correspond to regions of semiconductor material that are epitaxially grown in between buried insulator portions of the semiconductor substrate.

The PCM switching device 126 comprises a strip of phase change material 128. The strip of phase change material 128 is formed from a material that can be transitioned between two different phases that each have different electrical conductivity. For example, the strip of phase change material 128 may comprise a material that changes from an amorphous state to a crystalline state based upon the application of heat to the phase change material, wherein the phase change material is electrically insulating (i.e., blocks an electrical connection) in the amorphous state and is electrically conductive (I.e., provides a low electrical resistance current path) in the crystalline state. Examples of phase change materials having this property include chalcogenides and chalcogenide alloys. Specifically, these phase change materials may include germanium-antimony-tellurium (GST), germanium-tellurium, and germanium-antimony.

The PCM switching device 126 additionally comprises a heating element 130. The heating element 130 is formed from a conductive or semi-conductive material that converts electrical energy into heat through ohmic heating. Examples of these materials include nickel, chromium, molybdenum, tungsten, platinum, and alloys thereof. The heating element 130 may be an elongated structure that extends transversely to the current flow direction of the phase change material and contacts heating terminals in locations that are in different cross-sectional planes than the cross-sectional view of FIG. 1. The heating element 130 is thermally coupled to the strip of phase change material 128. This means that the heating element 130 is in sufficient proximity to the strip of phase change material 128 to rapidly transfer heat to change the conductive state of the strip of phase change material 128 in the above-described manner. An intermediary material may be arranged between the heating element 130 and the strip of phase change material 128 in a thermally coupled arrangement, wherein the intermediary material is sufficiently thin and/or thermally conductive to enable efficient heat transfer. For example, in the depicted embodiment, an insulating liner 132 is interposed between the heating element 130 and the strip of phase change material 128. The insulating liner 132 electrically isolates the heating element 130 from the strip of phase change material 128 while simultaneously permitting substantial heat transfer between the two. To this end, the insulating liner 132 may be a relatively thin (e.g., less than 1 μm thick, e.g., between 25 nm and 200 nm thick, e.g., between 50 nm and 100 nm thick) layer of dielectric material, e.g., silicon dioxide, silicon nitride, silicon oxynitride, AlN, etc.

The PCM switching device 126 additionally comprises an RF input contact 129 and an RF output contact 131. The RF input contact 129 and the RF output contact 131 are each formed from electrically conductive materials, e.g., metals such as copper, aluminum, nickel, chromium, molybdenum, tungsten, platinum, titanium, and alloys thereof, and doped polycrystalline materials. The RF input contact 129 and the RF output contact 131 may be formed from the same material as the heating element 130. However, this is not necessary. The RF input contact 129 and the RF output contact 131 are each in ohmic contact with the strip of phase change material 128 at opposite ends.

The working principle of the PCM switching device 126 is as follows. The PCM switching device 126 is a lateral device that is configured to conduct parallel to a main surface of the semiconductor substrate 102. The heating element 130 is configured to control a conductive connection between the RF input contact 129 and the RF output contact 131. The heating element 130 controls this conductive connection by applying heat to the strip of phase change material 128. In an OFF state of the PCM switching device 126, the strip of phase change material 128 is in an amorphous state or partially amorphous. As a result, the strip of phase change material 128 blocks a voltage held between the RF input contact 129 and the RF output contact 131. In an ON state of the PCM switching device 126, the strip of phase change material 128 is in a crystalline state. As a result, the strip of phase change material 128 provides a low-resistance electrical connection between the RF input contact 129 and the RF output contact 131. Thus, a current may flow laterally through the strip of phase change material 128 in this state. The PCM switching device 126 performs a switching operation by using the heating element 130 to heat the strip of phase change material 128. The phase change material may be transitioned to the amorphous state by applying short pulses (e.g., pulses in the range of 50-1,000 nanoseconds) of high intensity heat which causes the phase change material to reach a melting temperature, e.g., in the range of 600° C. to 750° C., followed by a rapid cooling of the material. This is referred to as a "reset pulse." The phase change material of the strip of phase change material 128 may be transitioned to the crystalline state by applying longer duration pulses (e.g., pulses in the range of 0.5-10 microseconds) of lower intensity heat, which causes the phase change material to reach a temperature at which the material quickly crystallizes and is highly conductive, e.g., in the range of 250° C. to 350° C. This is referred to as a "set pulse."

The PCM switching device 126 may be formed according to the following steps. Initially, the semiconductor substrate 102 is provided and a base layer 133 of dielectric material, e.g., silicon dioxide, silicon nitride, silicon oxynitride, etc., is formed on the main surface of the semiconductor substrate 102. Trenches are formed in the base layer 133 of dielectric material, and the RF input contact 129, the RF output contact 131, and the heating element 130 are formed in these trenches. Each of these structures may be formed by a common layer of metal that is conformally deposited and subsequently planarized. In other embodiments, the RF input contact 129 and the RF output contact 131 are formed by separate deposition steps as the heating element 130 and hence may have a different material composition. Subsequently, a thin dielectric layer comprising e.g., silicon dioxide, silicon nitride, silicon oxynitride, etc., is formed over the RF input contact 129, the RF output contact 131, and the heating element 130. This thin dielectric layer may be patterned to expose the RF input contact 129 and the RF output contact 131 from above while simultaneously providing the insulating liner 132 over the heating element 130. Subsequently a layer of phase change material is conformally deposited so as to contact the RF input contact 129 and the RF output contact 131. Layers of a capping structure 135, which will be described in further detail below with reference to FIG. 2, may be deposited on the layer of the phase change material. Subsequently, an etching process may be performed to structure the layer of the phase change material into the strip of phase change material 128 and any layers used to form the capping structure 135. As shown, the PCM switching device 126 additionally comprises an encapsulation layer 137 of dielectric material, e.g., silicon dioxide, silicon nitride, silicon oxynitride, etc., formed over the capping structure 135 and laterally surrounding the PCM switching device 126. This encapsulation layer 137 may be a relatively thick, e.g., 100 nm to 200 nm thick region comprising a layer of dielectric material that is used as a hardmask to pattern the phase change material and, optionally, may comprise additional layers of dielectric material formed after the etching process that are used to provide additional encapsulation after etching is completed.

The semiconductor device additionally comprises an interconnection region 106 that is formed over the PCM switching device 126. The interconnection region 106 electrically isolates the PCM switching device 126 and is used to electrically connect the PCM switching device 126 with other devices/and or to externally accessible terminals on an outer surface of the semiconductor device. In particular, the RF input contact 129 and the RF output contact 131 may be routed to externally accessible bond pads (not shown) via the interconnection region 106. The interconnection region 106 comprises metallization layers 108 formed of, e.g., copper, aluminum, nickel, etc., and alloys thereof, that are structured into conductive tracks and routed along a wiring plane to form electrical interconnect. The interconnection region 106 additionally comprises interlayer dielectric regions 110 that are formed from electrically insulating materials such as silicon dioxide, silicon nitride, silicon oxynitride, glass, polymers, etc. and through vias that extend through one or more of the interlayer dielectric regions 110 and provide vertical connectivity between the various levels of metallization.

Figure 2:
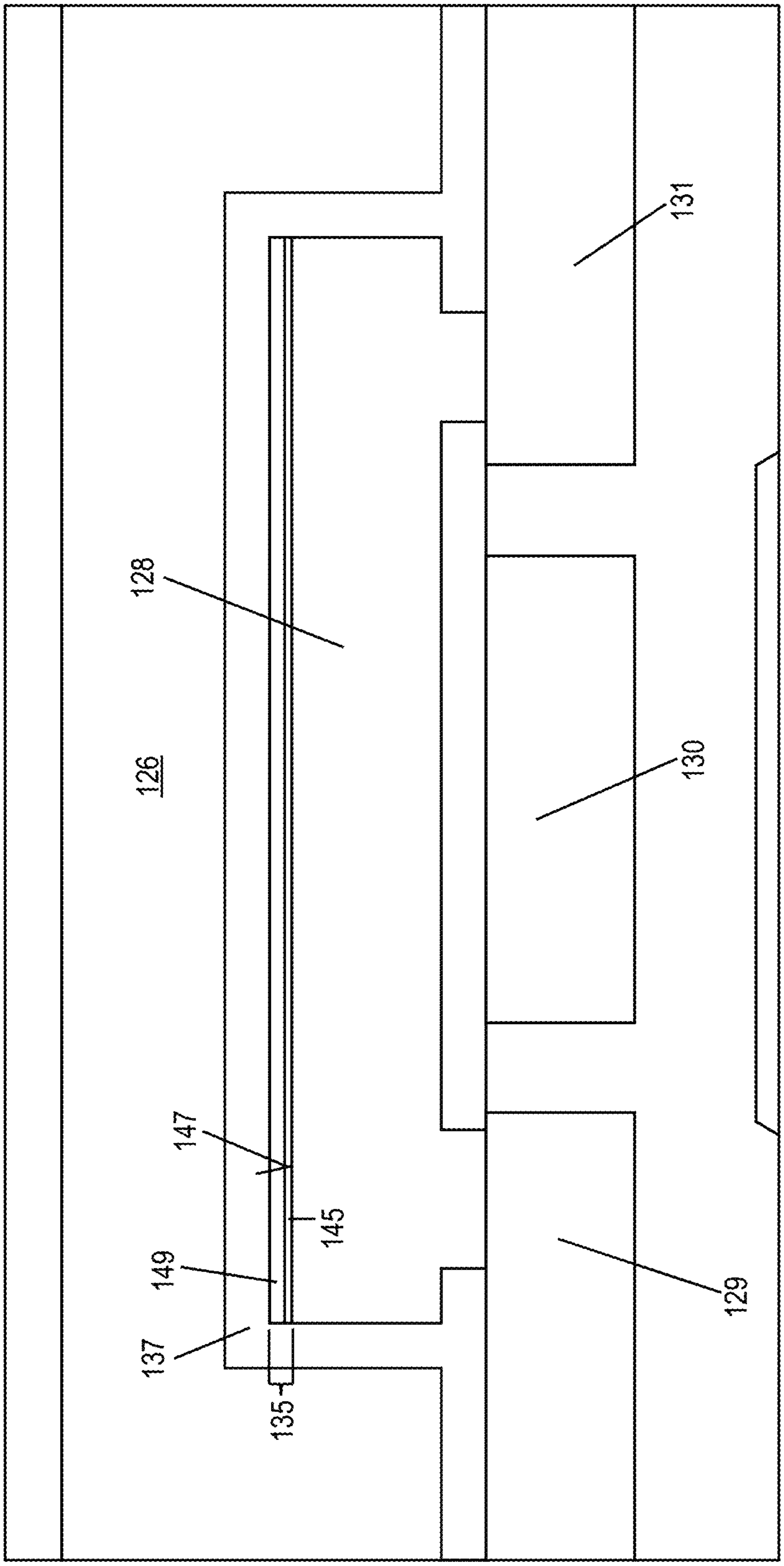
FIG. 2 illustrates an enlarged view of the PCM switching device, according to an embodiment.

Referring to FIG. 2, a close-up view of the PCM switching device 126 is shown. The PCM switching device 126 comprises a capping structure 135. The capping structure 135 is formed locally on the strip of phase change material 128. That is, the capping structure 135 does not extend past the outer edge sides of the strip of phase change material 128. As mentioned above, the layers of the capping structure 135 may be etched simultaneously with the phase change material, thus making the capping structure 135 and the strip of phase change material 128 coextensive with one another.

The capping structure 135 comprises an adhesion layer 145. The adhesion layer 145 forms a direct interface with a first surface 147 from the strip of phase change material 128. That is, the adhesion layer 145 directly contacts the first surface 147 of the strip of phase change material 128. In the depicted embodiment, the first surface 147 of the strip of phase change material 128 corresponds to an upper surface that is opposite from the semiconductor substrate 102. The adhesion layer 145 separates the first surface 147 from any dielectric material thereon. That is, the adhesion layer 145 is interposed between the first surface 147 of the of phase change material 128 and any dielectric region or layer that is formed on the adhesion layer 145. For example, the adhesion layer 145 may separate the first surface 147 from any region of $SiO_2$, SiN, $SiO_XN_Y$, MexOy, MexNy, MexOyNz, etc. In the depicted embodiment, the capping structure 135 additionally comprises a dielectric capping layer 149 that is formed on the adhesion layer 145. The adhesion layer 145 therefore separates the first surface 147 of the strip of phase change material 128 from the dielectric capping layer 149. The dielectric capping layer 149 may be a layer comprising, e.g., silicon dioxide, silicon nitride, silicon oxynitride, etc. The dielectric capping layer 149 may be on the order of 10 nm to less than 1 μm thick.

The phase change material 128 may be subjected to high temperatures, e.g., temperatures on the order 300° C., 400° C., 500° or higher, e.g., during subsequent processing steps, e.g., thermal oxidation, testing, etc., and/or during operation of the PCM switching device 126. These high temperatures create the potential for delamination at the surfaces of the PCM switching device 126. In particular, dielectric materials that are formed on the PCM switching device 126 may delaminate from the strip of phase change material 128, due to for example differences in CTE (coefficient of thermal expansion). The adhesion layer 145 has a material composition that provides better adherence to the phase change material than the dielectric materials under these conditions. For example, the adhesion layer 145 may be formed from semiconductor materials with a closer CTE match to the phase change material than the dielectric materials. Examples of these semiconductor materials include silicon, carbon, germanium, gallium, tantalum, aluminum and alloys or compounds thereof. The adhesion layer 145 may be formed by semiconductor deposition techniques such as atomic layer deposition, epitaxy, etc.

According to an embodiment, an electrical resistance of the adhesion layer 145 is at least $10^5\Omega$ greater than an electrical resistance of the strip of phase change material 128 between the RF input contact 129 and the RF output contact 131. For example, the electrical resistance of the adhesion layer 145 may be in the range of $1\times10^5\Omega$ and $5\times10^6\Omega$ greater than the strip of phase change material 128 between the RF input contact 129 and the RF output contact 131. By maintaining this relationship between the electrical resistance of the adhesion layer 145 and the phase change material, the off-resistance of the PCM switching device 126 is maintained advantageously high In more detail, the adhesion layer 145 represents a potential shunt path for current to flow between the RF input contact 129 and an RF output contact 131 and bypass the voltage blocking provided by the strip of phase change material 128. Maintaining a high electrical resistivity of the adhesion layer 145 mitigates this shunt effect and prevents off-state leakage of the device.

According to an embodiment, the adhesion layer 145 is a silicon layer, i.e., a layer of elemental silicon. This silicon adhesion layer 145 may be formed to be very thin, e.g., on the order of 2 nm to 20 nm. In an embodiment, the thickness of the silicon adhesion layer 145 is no greater than 15 nm and may be no greater than 10 nm or less. By providing a silicon adhesion layer 145 with these thickness values, the adhesion layer 145 provides both substantial mitigation of delamination and meets the above-described electrical resistivity requirements to maintain the off-state leakage of the device at acceptable levels. States another way, reducing the thickness of the adhesion layer 145 reduces the cross-sectional area and consequently reduces the electrical resistance. A similar principle may be used to control the thickness of other types of materials to meet the above-described electrical resistivity requirements. The adhesion layer 145 may have a substantially constant thickness throughout the length of the adhesion layer 145. To the extent that there is any thickness variation, the aforementioned thickness values may refer to the maximum thickness of the adhesion layer 145. Moreover, the adhesion layer 145 may preferably be formed with low doping levels, e.g., intrinsic levels, and may have monocrystalline crystallographic structure, to the extent possible at the above-mentioned thickness values, to maintain low resistivity.

In addition to the depicted semiconductor device 100, embodiments of a phase change switching device may have many different configurations and obtain the advantageous mitigation of lamination provided by an adhesion layer as described herein. Generally speaking, these devices include any configuration wherein a phase change switching device is embedded within a dielectric material and an adhesion layer as described herein is interposed between a surface of the phase change material and the dielectric material. For example, the dielectric capping layer 149 from the capping structure 135 may be omitted. In that case, a corresponding adhesion layer 145 may be used to separate the first surface 147 of the strip of phase change material 128 from a dielectric material, e.g., the dielectric material of the encapsulation layer 137 or any other dielectric region formed thereon. The adhesion layer may be applied to different surfaces of the phase change material with different configurations. For example, depending on the configuration of the device, a corresponding adhesion layer 145 may be provided on an underside of the strip of phase change material that faces the semiconductor substrate, and used to separate the strip of phase change from any subjacent dielectric material. Separately or in combination, the arrangement of elements in the phase change switching device may vary from the depicted embodiment. For instance, electrical contact with the strip of phase change material 128 may be effectuated at an upper side of the strip of phase change material opposite from the semiconductor substrate. Separately or in combination, the heating element 130 may be arranged over an upper side of the strip of phase change material opposite from the semiconductor substrate 102 or may be arranged to face multiple sides of the strip of phase change material.

Although the present disclosure is not so limited, the following numbered examples demonstrate one or more aspects of the disclosure.

Example 1. A semiconductor device, comprising: a semiconductor substrate; a phase change switching device formed over the semiconductor substrate, the phase change switching device comprising a strip of phase change material connected between an RF input contact and an RF output contact, and a heating element thermally coupled to the strip of phase change material; and a silicon adhesion layer that forms a direct interface with a first surface of the strip of phase change material and separates the first surface from a dielectric material formed thereon.

Example 2. The semiconductor device of example 1, wherein an electrical resistance of the silicon adhesion layer is at least 105Ω greater than an electrical resistance of the strip of phase change material between the RF input contact and the RF output contact.

Example 3. The semiconductor device of example 2, wherein a thickness of the silicon adhesion layer is less than or equal to 20 nm.

Example 4. The semiconductor device of example 1, wherein the dielectric material that the silicon adhesion layer separates the first surface from comprises any one of: SiN, SiO2 and $SiO_XN_Y$.

Example 5. The semiconductor device of example 1, wherein the semiconductor device comprises a capping structure that is locally formed on the strip of phase change material, wherein the capping structure comprises the silicon adhesion layer and a dielectric capping layer, and wherein the silicon adhesion layer separates the first surface from the dielectric capping layer.

Example 6. The semiconductor device of example 5, wherein the dielectric capping layer is a layer of SiN.

Example 7. The semiconductor device of example 5, wherein the semiconductor device further comprises an encapsulation layer of dielectric material formed over the capping structure and laterally surrounding the phase change switching device.

Example 8. The semiconductor device of example 1, wherein the phase change switching device is a lateral device that is configured to conduct parallel to a main surface of the semiconductor substrate.

Example 9. The semiconductor device of example 8, wherein the first surface of the strip of phase change material is an upper surface of the strip of phase change material that faces away from the main surface.

Example 10. The semiconductor device of example 8, wherein the RF input contact, the RF output contact, and the heating element area each disposed below the strip of phase change material.

Example 11. A method of forming a semiconductor device, the method comprising: providing a semiconductor substrate; forming a phase change switching device over the semiconductor substrate, the phase change switching device comprising a strip of phase change material connected between an RF input contact and an RF output contact, and a heating element thermally coupled to the strip of phase change material; and forming a silicon adhesion layer that forms a direct interface with a first surface of the strip of phase change material and separates the first surface from a dielectric material formed thereon.

Example 12. The method of example 11, wherein an electrical resistance of the silicon adhesion layer is at least 105Ω greater than an electrical resistance of the strip of phase change material between the RF input contact and the RF output contact.

Example 13. The method of example 11, wherein a thickness of the silicon adhesion layer is less than or equal to 20 nm.

Example 14. The method of example 11, wherein the dielectric material that the silicon adhesion layer separates the first surface from comprises any one of: SiN, $SiO_2$ and $SiO_XN_Y$.

Example 15. The method of example 11, further comprising forming a capping structure locally on the strip of phase change material, wherein the capping structure comprises the silicon adhesion layer and a dielectric capping layer, and wherein the silicon adhesion layer separates the first surface from the dielectric capping layer.

Example 16. The method of example 15, wherein the dielectric capping layer is a layer of SiN.

Example 17. The method of example 15, further comprising forming an encapsulation layer of dielectric material over the capping structure and laterally surrounding the phase change switching device.

Example 18. The method of example 11, wherein the phase change switching device is a lateral device that is configured to conduct parallel to a main surface of the semiconductor substrate.

Example 19. The method of example 18, wherein the first surface of the strip of phase change material is an upper surface of the strip of phase change material that faces away from the main surface.

Example 20. The method of example 18, wherein the RF input contact, the RF output contact, and the heating element area each disposed below the strip of phase change material.

The term "electrically connected," as used herein describes a permanent low-impedance connection between electrically connected elements, for example a direct contact between the relevant elements or a low-impedance connection via a metal and/or a highly doped semiconductor.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:

a semiconductor substrate;

a phase change switching device formed over the semiconductor substrate, the phase change switching device comprising a strip of phase change material connected between an RF input contact and an RF output contact, and a heating element thermally coupled to the strip of phase change material; and a layer of elemental silicon that forms a direct interface with a first surface of the strip of phase change material and separates the first surface from a dielectric material formed thereon.

2. The semiconductor device of claim 1, wherein an electrical resistance of the layer of elemental silicon is at least 10$^5$ Ω greater than an electrical resistance of the strip of phase change material between the RF input contact and the RF output contact.

3. The semiconductor device of claim 2, wherein a thickness of the layer of elemental silicon is less than or equal to 20 nm.

4. The semiconductor device of claim 1, wherein the dielectric material that the layer of elemental silicon separates the first surface from comprises any one of: SiN, $SiO_2$ and $SiO_XN_Y$.

5. The semiconductor device of claim 1, wherein the semiconductor device comprises a capping structure that is locally formed on the strip of phase change material, wherein the capping structure comprises the layer of elemental silicon and a dielectric capping layer, and wherein the layer of elemental silicon separates the first surface from the dielectric capping layer.

6. The semiconductor device of claim 5, wherein the dielectric capping layer is a layer of SiN.

7. The semiconductor device of claim 5, wherein the semiconductor device further comprises an encapsulation layer of dielectric material formed over the capping structure and laterally surrounding the phase change switching device.

8. The semiconductor device of claim 1, wherein the phase change switching device is a lateral device that is configured to conduct parallel to a main surface of the semiconductor substrate.

9. The semiconductor device of claim 8, wherein the first surface of the strip of phase change material is an upper surface of the strip of phase change material that faces away from the main surface.

10. The semiconductor device of claim 8, wherein the RF input contact, the RF output contact, and the heating element area each disposed below the strip of phase change material.

11. A method of forming a semiconductor device, the method comprising:

providing a semiconductor substrate;

forming a phase change switching device over the semiconductor substrate, the phase change switching device comprising a strip of phase change material connected between an RF input contact and an RF output contact, and a heating element thermally coupled to the strip of phase change material; and forming a layer of elemental silicon that forms a direct interface with a first surface of the strip of phase change material and separates the first surface from a dielectric material formed thereon.

12. The method of claim 11, wherein an electrical resistance of the layer of elemental silicon is at least 10$^5$ (greater than an electrical resistance of the strip of phase change material between the RF input contact and the RF output contact.

13. The method of claim 11, wherein a thickness of the layer of elemental silicon is less than or equal to 20 nm.

14. The method of claim 11, wherein the dielectric material that the layer of elemental silicon separates the first surface from comprises any one of: SiN, $SiO_2$ and $SiO_XN_Y$.

15. The method of claim 11, further comprising forming a capping structure locally on the strip of phase change material, wherein the capping structure comprises the layer of elemental silicon and a dielectric capping layer, and wherein the layer of elemental silicon separates the first surface from the dielectric capping layer.

16. The method of claim 15, wherein the dielectric capping layer is a layer of SiN.

17. The method of claim 15, further comprising forming an encapsulation layer of dielectric material over the capping structure and laterally surrounding the phase change switching device.

18. The method of claim 11, wherein the phase change switching device is a lateral device that is configured to conduct parallel to a main surface of the semiconductor substrate.

19. The method of claim 18, wherein the first surface of the strip of phase change material is an upper surface of the strip of phase change material that faces away from the main surface.

20. The method of claim 18, wherein the RF input contact, the RF output contact, and the heating element area each disposed below the strip of phase change material.

* * * * *